United States Patent
Waddell et al.

(10) Patent No.: US 9,894,815 B1
(45) Date of Patent: Feb. 13, 2018

(54) HEAT REMOVAL ASSEMBLY FOR USE WITH A POWER CONVERTER

(71) Applicant: General Electric Company, Schenectady, NY (US)

(72) Inventors: Alistair Martin Waddell, Bavaria (DE); Christian Meyer, Berlin (DE); Michael Bernhard Kocur, Berlin (DE); Mark Aaron Chan Chan, Bavaria (DE); Owen Schelenz, Berlin (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/231,136

(22) Filed: Aug. 8, 2016

(51) Int. Cl.
  *H05K 7/20* (2006.01)
  *H01L 23/473* (2006.01)
  *H01L 23/427* (2006.01)

(52) U.S. Cl.
  CPC ..... *H05K 7/20936* (2013.01); *H05K 7/20309* (2013.01); *H05K 7/20318* (2013.01); *H01L 23/427* (2013.01); *H01L 23/473* (2013.01)

(58) Field of Classification Search
  CPC ............. H05K 7/2089; H05K 7/20936; H05K 7/20309; H01L 23/427; H01L 23/473
  USPC ................. 361/679.46–679.54, 688–723; 165/80.4–80.5, 104.33, 104.21
  See application file for complete search history.

(56) References Cited

U.S. PATENT DOCUMENTS

| | | | |
|---|---|---|---|
| 6,152,215 A | 11/2000 | Niggemann | |
| 6,498,725 B2 | 12/2002 | Cole et al. | |
| 6,536,510 B2 | 3/2003 | Khrustalev et al. | |
| 6,772,603 B2 | 8/2004 | Hsu et al. | |
| 6,993,926 B2 | 2/2006 | Rini et al. | |
| 7,073,567 B2 * | 7/2006 | Berchowitz | F25B 39/02 165/175 |
| 7,096,928 B2 | 8/2006 | Phillips et al. | |
| 7,143,598 B2 | 12/2006 | Feger et al. | |
| 7,191,605 B2 | 3/2007 | Hsu et al. | |
| 7,266,969 B2 | 9/2007 | Hsu et al. | |

(Continued)

FOREIGN PATENT DOCUMENTS

| | | |
|---|---|---|
| EP | 1863085 A2 | 12/2007 |
| EP | 2284846 A1 | 2/2011 |

(Continued)

OTHER PUBLICATIONS

Pollock et al., "Dryout avoidance control for multi-evaporator vapor compression cycle cooling", Applied Energy, vol. 160, pp. 266-285, Dec. 15, 2015.

(Continued)

*Primary Examiner* — Zachary M Pape
(74) *Attorney, Agent, or Firm* — Nitin N. Joshi

(57) ABSTRACT

A heat removal assembly for use with a power converter that includes a condenser and an evaporator coupled in flow communication with the condenser. The evaporator is configured to channel working fluid therebetween. The evaporator includes a supply housing, a receiving housing, and at least one expansion housing extending between the supply housing and the receiving housing. The at least one expansion housing includes a flow inlet defined at the supply housing and a flow outlet defined at said receiving housing, and the flow inlet is sized smaller in cross-sectional size than the flow outlet.

18 Claims, 4 Drawing Sheets

(56) References Cited

U.S. PATENT DOCUMENTS

| | | | |
|---|---|---|---|
| 7,273,357 | B2 | 9/2007 | Hattori et al. |
| 7,791,885 | B2 | 9/2010 | Agostini et al. |
| 7,958,935 | B2 | 6/2011 | Belits et al. |
| 8,056,615 | B2 | 11/2011 | Downing |
| 8,286,439 | B2 | 10/2012 | Wu et al. |
| 8,549,749 | B2 | 10/2013 | Zimbeck et al. |
| 8,711,565 | B2 | 4/2014 | Wagoner et al. |
| 8,763,681 | B2 | 7/2014 | Agostini et al. |
| 8,879,259 | B2 * | 11/2014 | Suzuki ............... H05K 7/20936 165/104.33 |
| 8,913,386 | B2 | 12/2014 | Gradinger et al. |
| 8,976,526 | B2 | 3/2015 | Kulkarni et al. |
| 9,032,743 | B2 | 5/2015 | Agostini et al. |
| 9,113,578 | B2 * | 8/2015 | Cottet ................ H05K 7/20672 |
| 9,113,579 | B2 | 8/2015 | Cottet et al. |
| 9,179,575 | B1 | 11/2015 | Yao |
| 2005/0103487 | A1 | 5/2005 | Aflekt et al. |
| 2005/0284175 | A1 * | 12/2005 | Kulcke ................. B64D 13/06 62/515 |
| 2007/0095087 | A1 | 5/2007 | Wilson et al. |
| 2008/0060371 | A1 | 3/2008 | Jude |
| 2008/0179047 | A1 | 7/2008 | Yesin et al. |
| 2009/0056916 | A1 | 3/2009 | Yesin et al. |
| 2011/0192574 | A1 * | 8/2011 | Yoshikawa ......... F28D 15/0266 165/104.21 |
| 2012/0024500 | A1 | 2/2012 | Ng et al. |
| 2012/0067558 | A1 | 3/2012 | Phan et al. |
| 2012/0085114 | A1 | 4/2012 | Graaf et al. |
| 2012/0087088 | A1 | 4/2012 | Killion et al. |
| 2012/0186290 | A1 | 7/2012 | Howes et al. |
| 2012/0227429 | A1 | 9/2012 | Louvar et al. |
| 2012/0312037 | A1 | 12/2012 | Finney et al. |
| 2012/0324933 | A1 | 12/2012 | Louvar et al. |
| 2013/0125566 | A1 | 5/2013 | Grefe |
| 2013/0258594 | A1 | 10/2013 | Gradinger et al. |
| 2014/0020415 | A1 | 1/2014 | Heyl |
| 2014/0076522 | A1 | 3/2014 | Olesen et al. |
| 2014/0137582 | A1 | 5/2014 | Louvar et al. |
| 2014/0190189 | A1 | 7/2014 | Kowsky et al. |
| 2014/0196498 | A1 | 7/2014 | Xiao et al. |
| 2014/0251585 | A1 | 9/2014 | Kusuda et al. |
| 2014/0252864 | A1 | 9/2014 | Kulkarni et al. |
| 2015/0003015 | A1 | 1/2015 | Kulkarni et al. |
| 2015/0075184 | A1 | 3/2015 | Edwards et al. |
| 2015/0216079 | A1 * | 7/2015 | Kondou ................... F28F 1/40 165/104.21 |
| 2015/0257303 | A1 | 9/2015 | Shedd |
| 2016/0128231 | A1 | 5/2016 | Wagoner et al. |
| 2017/0010049 | A1 * | 1/2017 | Agostini ............... F28D 7/0075 |

FOREIGN PATENT DOCUMENTS

| | | | |
|---|---|---|---|
| EP | 2703763 | A1 | 3/2014 |
| EP | 2734020 | A1 | 5/2014 |
| EP | 2801780 | A1 | 11/2014 |
| WO | 2000040068 | A1 | 7/2000 |
| WO | 2000070289 | A1 | 11/2000 |
| WO | 03006910 | A1 | 1/2003 |
| WO | 2003006910 | A1 | 1/2003 |
| WO | 2003051657 | A1 | 6/2003 |
| WO | 2003063241 | A2 | 7/2003 |
| WO | 2010094662 | A3 | 2/2011 |
| WO | 2011044445 | A1 | 4/2011 |
| WO | 2011149216 | A2 | 12/2011 |
| WO | 2012131709 | A1 | 10/2012 |
| WO | 2013023279 | A1 | 2/2013 |
| WO | 2014048680 | A1 | 4/2014 |

OTHER PUBLICATIONS

Wagoner, Robert Gregory et al.; Co-pending U.S. Appl. No. 15/140,541 entitled "Cooling System with Pressure Regulation"; filed Apr. 28, 2016.

Chan, Mark Aaron Chan et al.; Co-pending U.S. PCT Application Serial No. PCT/US2016/033488 entitled "Cooling system and Methods of Assembling the Same"; filed May 20, 2016.

M. A. Chan et al., "Cooling system and Methods of Assembling the Same," PCT Application Serial No. PCT/US2016/033488, filed May 2, 2016.

International Search Report and Written Opinion issued in connection with corresponding PCT Application No. PCT/US2017/040728 dated Sep. 27, 2017.

\* cited by examiner

HEAT REMOVAL ASSEMBLY FOR USE WITH A POWER CONVERTER

BACKGROUND

The present disclosure relates generally to electric power converters and, more specifically, to a two-phase heat removal assembly configured to limit evaporator dry out.

Many known semiconductor devices are used for electric power conversion (e.g., rectifiers and inverters). Most known rectifiers are used for converting alternating current (AC) to direct current (DC) and most know inverters are used for converting DC current to AC current. Some of these rectifiers and inverters are integrated into full power conversion assemblies (i.e., power converters) used in renewable electric power generation facilities, such as solar power generation farms and wind turbine farms. The semiconductor devices typically generate large amounts of heat during operation of the power converters. At least some known power converters implement a two-phase liquid cooling system that include an evaporator for extracting heat from the semiconductor devices, and a condenser for dissipating the heat to an ambient environment. Two-phase liquid cooling systems are sometimes susceptible to dry out, in which all the working fluid in the evaporator has been converted to vapor and the evaporator contains no more working fluid to boil. As such, evaporator dry out may result in shutdown of the cooling system. Two-phase liquid cooling systems are particularly susceptible to dry out when rapid changes in thermal loading are induced to the evaporator.

BRIEF DESCRIPTION

In one aspect, a heat removal assembly for use with a power converter is provided. The heat removal assembly includes a condenser and an evaporator coupled in flow communication with the condenser. The evaporator is configured to channel working fluid therebetween. The evaporator includes a supply housing, a receiving housing, and at least one expansion housing extending between the supply housing and the receiving housing. The at least one expansion housing includes a flow inlet defined at the supply housing and a flow outlet defined at said receiving housing, and the flow inlet is sized smaller in cross-sectional size than the flow outlet.

In another aspect, an evaporator for use with a heat removal assembly is provided. The evaporator includes a supply housing, a receiving housing, and at least one expansion housing extending between the supply housing and the receiving housing. The at least one expansion housing includes a flow inlet defined at the supply housing and a flow outlet defined at the receiving housing, and the flow inlet is sized smaller in cross-sectional size than the flow outlet.

In yet another aspect, a power converter is provided. The power converter includes a plurality of electronic components, and a heat removal assembly including a condenser and an evaporator coupled in flow communication with the condenser. The evaporator is configured to channel working fluid therebetween, and is thermally coupled with the plurality of electronic components. The evaporator includes a supply housing, a receiving housing, and at least one expansion housing extending between the supply housing and the receiving housing. The at least one expansion housing includes a flow inlet defined at the supply housing and a flow outlet defined at the receiving housing, and the flow inlet is sized smaller in cross-sectional size than the flow outlet.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

Embodiments of the present disclosure relate to a two-phase heat removal assembly designed to limit evaporator dry out. More specifically, the assembly includes a condenser and an evaporator coupled in flow communication with the condenser. The evaporator includes an expansion housing for receiving heat transferred from a heat load. Moreover, the expansion housing includes a flow inlet and a flow outlet for channeling working fluid into and out of the expansion housing. The flow inlet is sized smaller than the flow outlet to restrict backflow of working fluid through the flow inlet during rapid step changes in thermal loading induced to the evaporator. For example, rapidly increasing the thermal loading induced to the evaporator can cause all the working fluid in the evaporator to vaporize. It has also been found that the vaporized working fluid can sometimes backflow, which restricts the intake of additional working fluid in the evaporator, thereby resulting in cooling system shutdown. Sizing the flow inlet smaller than the flow outlet and forming expansion housing with an asymmetrical design facilitates forcing the vaporized working fluid towards the flow outlet such that additional working fluid can enter the expansion housing.

Figure 1:
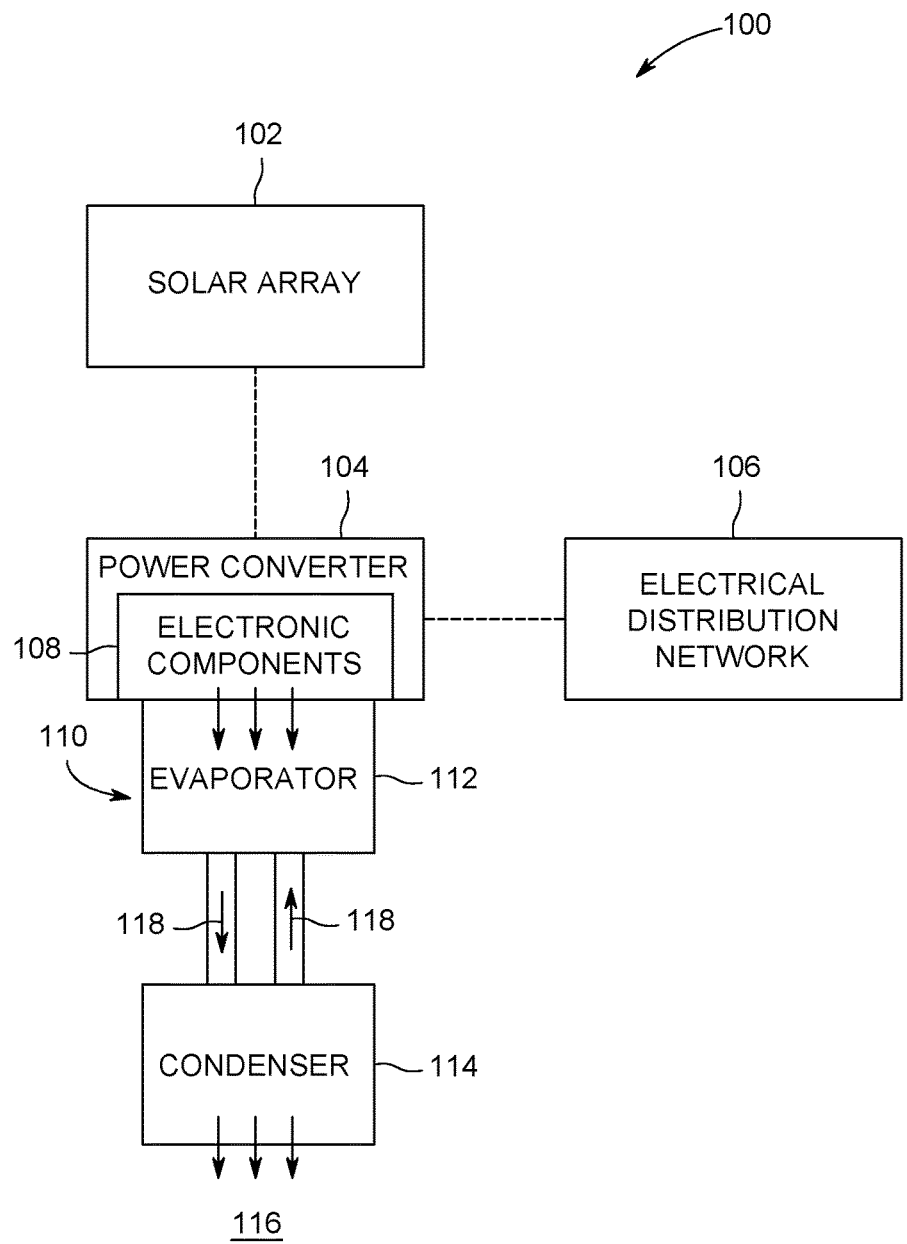
FIG. 1 is a schematic diagram of an exemplary power generation system.

FIG. 1 is a schematic diagram of an exemplary power generation system 100 that includes one or more power generation units, such as a solar array 102 formed from a plurality of solar panels (not shown). Alternatively, power generation system 100 includes any suitable number and type of power generation units, such as a plurality of wind turbines, fuel cells, geothermal generators, hydropower generators, and/or other devices that generate power from renewable and/or non-renewable energy sources.

In the exemplary embodiment, solar array 102 includes any number of solar panels that facilitate operating power generation system 100 at a desired power output. In one embodiment, power generation system 100 includes a plurality of solar panels and/or solar arrays 102 coupled together in a series-parallel configuration to facilitate generating a desired current and/or voltage output from power generation system 100. The solar panels include one or more of a photovoltaic panel, a solar thermal collector, or any other device that converts solar energy to electrical energy. In the exemplary embodiment, the solar panels of solar array 102 are photovoltaic panels that generate direct current (DC) power resulting from receiving solar energy at the solar panels.

In the exemplary embodiment, solar array 102 is coupled to a power conversion assembly, such as a power converter 104, that converts the DC power to alternating current (AC) power. More specifically, power converter 104 includes one or more electronic components 108 for converting the DC power to AC power. Electronic components 108 include one or more semiconductor devices, such as a DC-AC inverter (not shown) that converts DC power received from solar array 102 into AC power for transmission to an electrical distribution network 106. Power converter 104 adjusts an amplitude of the voltage and/or current of the converted AC power to an amplitude suitable for use by electrical distribution network 106, and provides AC power at a frequency and a phase that are substantially equal to the frequency and phase of electrical distribution network 106. Moreover, in the exemplary embodiment, power converter 104 provides three-phase AC power to electrical distribution network 106. Alternatively, power converter 104 provides single phase AC power or any other number of phases of AC power to electrical distribution network 106.

Heat is typically generated by electronic components 108 during operation of power converter 104. As such, power converter 104 includes a heat removal assembly 110 for dissipating heat from electronic components 108. In the exemplary embodiment, heat removal assembly 110 is a two-phase liquid cooling system that includes an evaporator 112 and a condenser 114. Evaporator 112 is thermally coupled to electronic components 108 and condenser 114 is coupled in flow communication with condenser 114 for dissipating heat generated by electronic components 108 to an ambient environment 116, for example. More specifically, working fluid 118 is channeled between evaporator 112 and condenser 114 for removing heat from electronic components 108, as will be described in more detail below.

Figure 2:
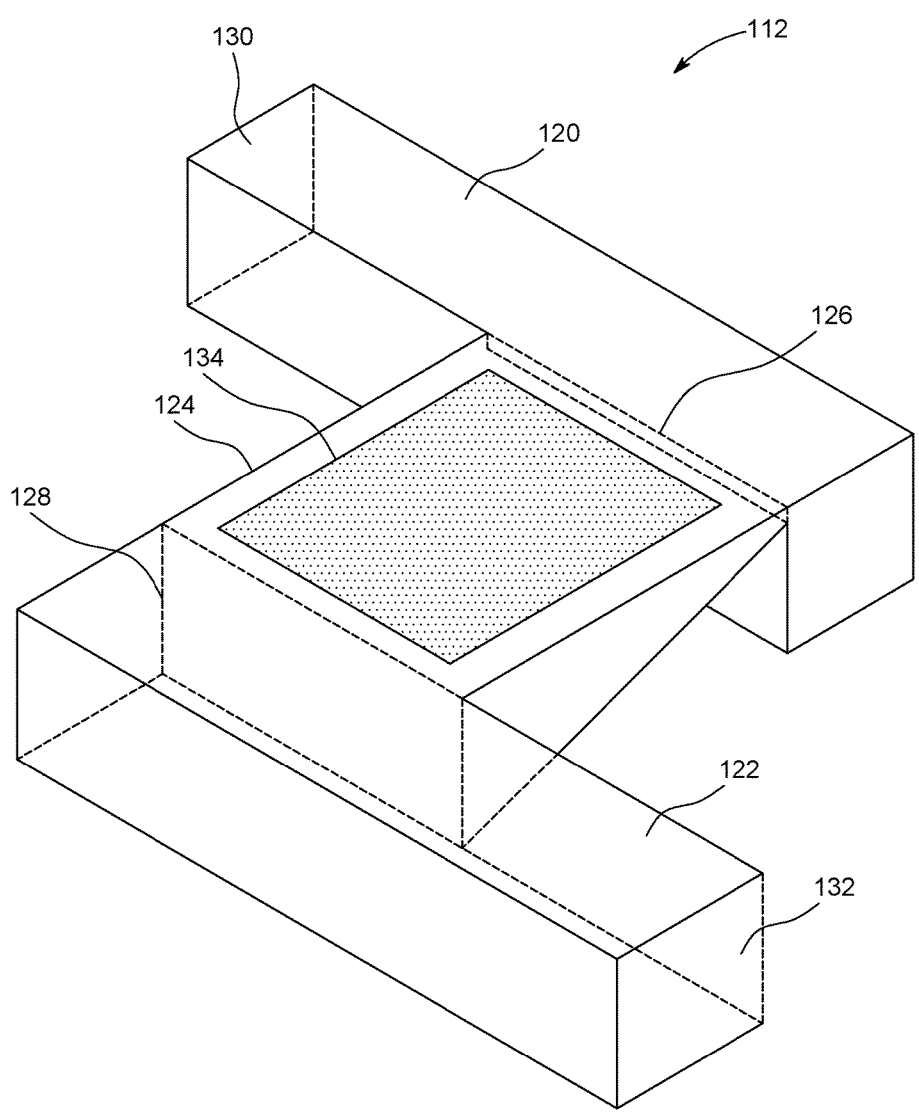
FIG. 2 is a perspective view of an exemplary evaporator that may be used in a power converter of the power generation system shown in FIG. 1.
Figure 3:
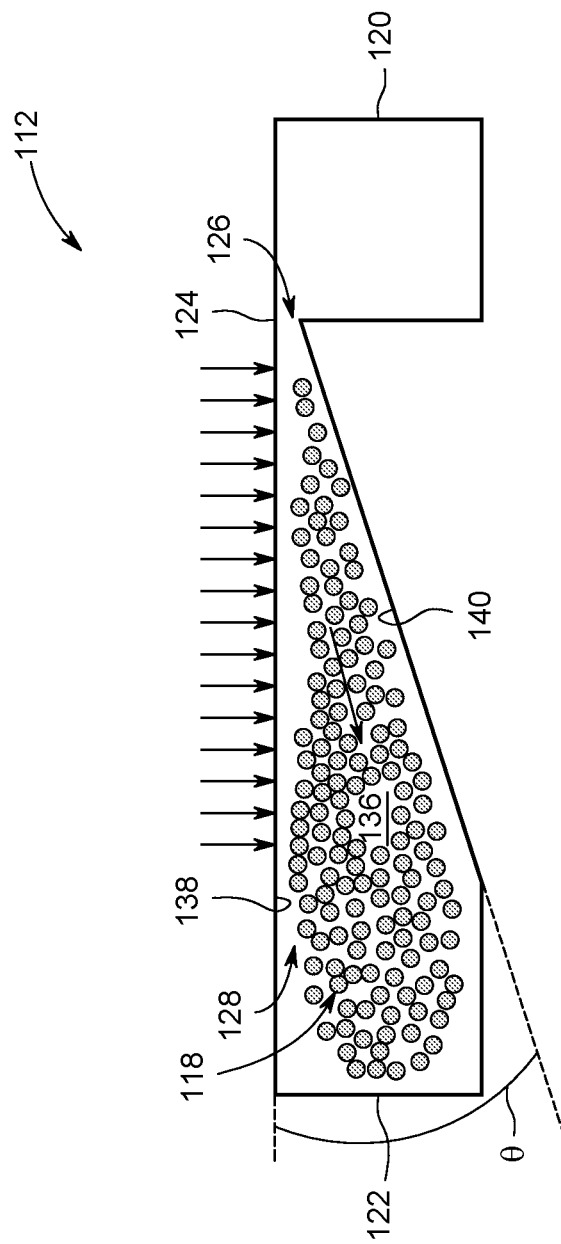
FIG. 3 is a cutaway side view of the evaporator shown in FIG. 2.

FIG. 2 is a perspective view of an exemplary evaporator 112 that may be used in power converter 104 of power generation system 100 (each shown in FIG. 1), and FIG. 3 is a cutaway side view of evaporator 112. In the exemplary embodiment, evaporator 112 includes a supply housing 120, a receiving housing 122, and an expansion housing 124 extending between supply housing 120 and receiving housing 122. Expansion housing 124 includes a flow inlet 126 defined at supply housing 120 and a flow outlet 128 defined at receiving housing 122. Moreover, supply housing 120 includes a first flow opening 130 defined therein and receiving housing 122 includes a second flow opening 132 defined therein.

In the exemplary embodiment, supply housing 120 and receiving housing 122 are oriented such that first flow opening 130 and second flow opening 132 are oppositely faced relative to each other. As such, in one embodiment, multiple evaporators 112 are coupled together end-to-end at first flow opening 130 and second flow opening 132 to increase the cooling capacity of heat removal assembly 110. Alternatively, as will be described in more detail below, the multiple evaporators 112 are formed integrally as a unitary structure. Moreover, in an alternative embodiment, at least a portion of each of supply housing 120 and receiving housing 122 are oriented oppositely perpendicular relative to expansion housing 124 such that multiple evaporators 112 are vertically stackable on top of each other.

As described above, working fluid 118 is channeled through heat removal assembly 110 (each shown in FIG. 1). More specifically, working fluid 118 is channeled into supply housing 120 through first flow opening 130 from condenser 114 (shown in FIG. 1), and supply housing 120 supplies expansion housing 124 with working fluid 118 through flow inlet 126. In addition, working fluid 118 discharged from expansion housing 124 through flow outlet 128 is received within receiving housing 122, and receiving housing 122 discharges working fluid 118 towards condenser 114 through second flow opening 132. In one embodiment, expansion housing 124 is thermally coupled to a heat load 134, such as electronic components 108 of power converter 104 (each shown in FIG. 1). As such, heat transferred from heat load 134 facilitates vaporizing working fluid 118 channeled through expansion housing 124 such that heat is dissipated from heat load 134.

In the exemplary embodiment, expansion housing 124 has an asymmetric design such that flow inlet 126 is sized smaller than flow outlet 128. More specifically, expansion housing 124 is designed such that flow inlet 126 has a smaller cross-sectional area than flow outlet 128. For example, referring to FIG. 3, expansion housing 124 includes an interior 136 that progressively increases in size (i.e., increases in volumetric capacity) from flow inlet 126 towards flow outlet 128. As described above, heat transferred from heat load 134 facilitates vaporizing working fluid 118 channeled through expansion housing 124. When vaporized from a liquid state, the volume of working fluid 118 increases in accordance with the Ideal Gas Law. As such, progressively increasing the size of expansion housing 124 facilitates accommodating the increased volume of working fluid 118 channeled through expansion housing 124 such that the vaporized working fluid 118 is forced towards flow outlet 128 and backflow is restricted through flow inlet 126. In one embodiment, a ratio of a cross-sectional area of flow inlet 126 relative to a cross-sectional area of flow outlet 128 is less than or equal to about 0.5.

Moreover, interior 136 of expansion housing 124 is defined between a first flat surface 138 and a second flat surface 140 that each extend between flow inlet 126 and flow outlet 128. First flat surface 138 and second flat surface 140 are angled relative to each other by an angle Θ. Angle Θ is defined within a range between about 0 degrees and about 90 degrees. Angling first flat surface 138 and second flat surface 140 relative to each other facilitates progressively increasing the size of interior 136 from flow inlet 126 towards flow outlet 128. In an alternative embodiment, second flat surface 140 has a stepped design for increasing the size of interior 136 at predetermined intervals from flow inlet 126 towards flow outlet 128.

Figure 4:
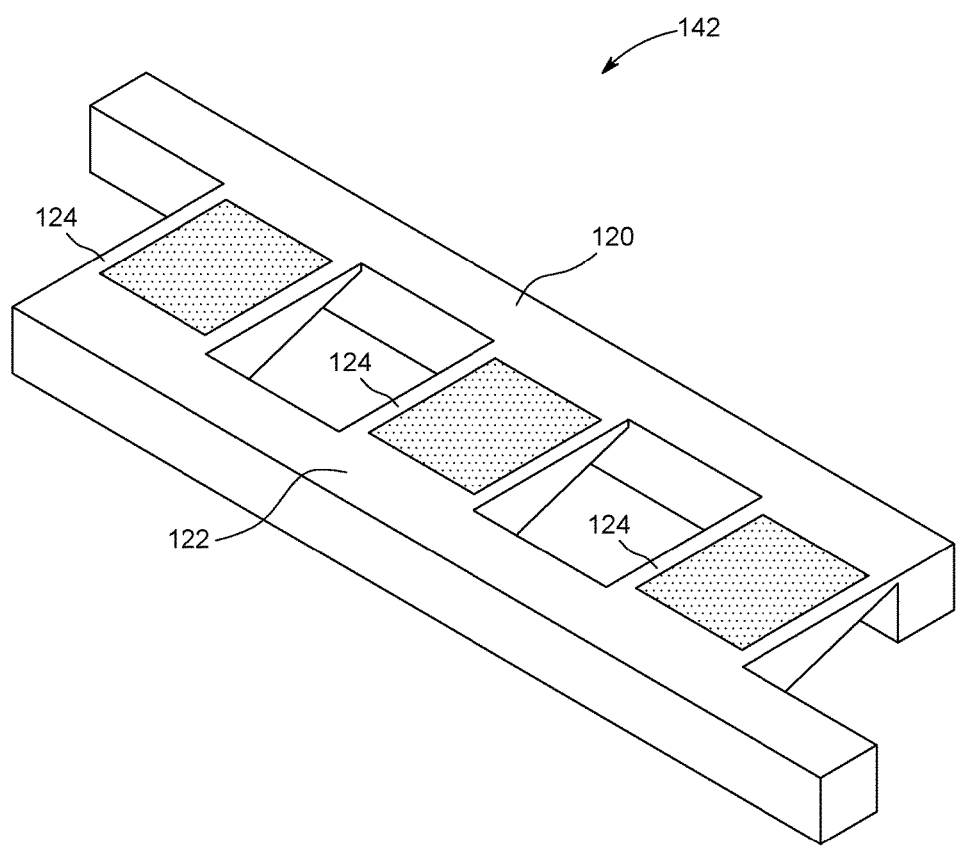
FIG. 4 is a perspective view of an alternative evaporator that may be used in a power converter of the power generation system shown in FIG. 1.

FIG. 4 is a perspective illustration of an alternative evaporator 142 that may be used in power converter 104 of the power generation system 100 (each shown in FIG. 1). In the exemplary embodiment, evaporator 142 includes a plurality of expansion housings 124 arranged in parallel between supply housing 120 and receiving housing 122. As such, the cooling capacity of evaporator 142 is greater than evaporator 112 (shown in FIG. 2). Moreover, supply housing 120 and receiving housing 122 extend between each of the plurality of expansion housings 124. As such, supply housing 120 and receiving housing 122 act as manifolds for simultaneously supplying and receiving working fluid from the plurality of expansion housings 124 during operation of power converter 104.

An exemplary technical effect of the system and methods described herein includes at least one of: (a) restricting backflow in an evaporator of a two-phase liquid cooling system; (b) reducing the likelihood of dry out in the two-phase liquid cooling system; (c) increasing the operability of a heat removal assembly incorporating the evaporator described herein; and (d) reducing flow oscillations of expanding fluid discharged from the evaporator.

Exemplary embodiments of a heat removal assembly and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with only power generation plants and related methods as described herein. Rather, the exemplary embodiment can be implemented and utilized in connection with many applications where dissipating heat from a heat load is desired.

Although specific features of various embodiments of the present disclosure may be shown in some drawings and not in others, this is for convenience only. In accordance with the principles of embodiments of the present disclosure, any feature of a drawing may be referenced and/or claimed in combination with any feature of any other drawing.

This written description uses examples to disclose the embodiments of the present disclosure, including the best mode, and also to enable any person skilled in the art to practice embodiments of the present disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A heat removal assembly for use with a power converter, said heat removal assembly comprising:
 a condenser; and
 an evaporator coupled in flow communication with said condenser, said evaporator configured to channel working fluid therebetween, said evaporator comprising:
  a supply housing;
  a receiving housing; and
  at least one expansion housing extending between said supply housing and said receiving housing, wherein said at least one expansion housing comprises a flow inlet defined at said supply housing and a flow outlet defined at said receiving housing, said flow inlet sized smaller in cross-sectional size than said flow outlet;
 wherein said at least one expansion housing comprises a plurality of expansion housings arranged in parallel between said supply housing and said receiving housing.

2. The assembly in accordance with claim 1, wherein said at least one expansion housing comprises an interior that progressively increases in size from said flow inlet towards said flow outlet.

3. The assembly in accordance with claim 1, wherein said at least one expansion housing has an asymmetric design such that said flow inlet has a smaller cross-sectional area than said flow outlet.

4. The assembly in accordance with claim 1, wherein a ratio of a cross-sectional area of said flow inlet relative to a cross-sectional area of said flow outlet is less than or equal to about 0.5.

5. The assembly in accordance with claim 1, wherein said at least one expansion housing is configured to thermally couple to a heat load such that heat transferred from the heat load at least partially vaporizes the working fluid channeled through said at least one expansion housing.

6. The assembly in accordance with claim 1, wherein said expansion housing comprises an interior defined by a first flat surface and a second flat surface that each extend between said flow inlet and said flow outlet, wherein said first flat surface and said second flat surface are angled relative to each other.

7. An evaporator for use with a heat removal assembly, said evaporator comprising:
 a supply housing;
 a receiving housing; and
 at least one expansion housing extending between said supply housing and said receiving housing, wherein said at least one expansion housing comprises a flow inlet defined at said supply housing and a flow outlet defined at said receiving housing, said flow inlet sized smaller in cross-sectional size than said flow outlet;
 wherein said at least one expansion housing comprises a plurality of expansion housings arranged in parallel between said supply housing and said receiving housing.

8. The evaporator in accordance with claim 7, wherein said at least one expansion housing comprises an interior that progressively increases in size from said flow inlet towards said flow outlet.

9. The evaporator in accordance with claim 7, wherein said at least one expansion housing has an asymmetric design such that said flow inlet has a smaller cross-sectional area than said flow outlet.

10. The evaporator in accordance with claim 7, wherein a ratio of a cross-sectional area of said flow inlet relative to a cross-sectional area of said flow outlet is less than or equal to about 0.5.

11. The evaporator in accordance with claim 7, wherein said at least one expansion housing is configured to thermally couple to a heat load such that heat transferred from the heat load at least partially vaporizes the working fluid channeled through said at least one expansion housing.

12. The evaporator in accordance with claim 7, wherein said expansion housing comprises an interior defined by a first flat surface and a second flat surface that each extend between said flow inlet and said flow outlet, wherein said first flat surface and said second flat surface are angled relative to each other.

13. A power converter comprising:
 a plurality of electronic components; and
 a heat removal assembly comprising:
  a condenser; and
  an evaporator coupled in flow communication with said condenser, said evaporator configured to channel working fluid therebetween, said evaporator further thermally coupled with said plurality of electronic components, said evaporator comprising:
   a supply housing;
   a receiving housing; and
   at least one expansion housing extending between said supply housing and said receiving housing, wherein said at least one expansion housing comprises a flow inlet defined at said supply housing and a flow outlet defined at said receiving housing, said flow inlet sized smaller in cross-sectional size than said flow outlet
  wherein said at least one expansion housing comprises a plurality of expansion housings arranged in parallel between said supply housing and said receiving housing.

14. The power converter in accordance with claim 13, wherein said at least one expansion housing comprises an interior that progressively increases in size from said flow inlet towards said flow outlet.

15. The power converter in accordance with claim 13, wherein said at least one expansion housing has an asymmetric design such that said flow inlet has a smaller cross-sectional area than said flow outlet.

16. The power converter in accordance with claim 13, wherein a ratio of a cross-sectional area of said flow inlet relative to a cross-sectional area of said flow outlet is less than or equal to about 0.5.

17. The power converter in accordance with claim 13, wherein said at least one expansion housing is thermally coupled to said plurality of electronic components such that heat transferred from the plurality of electronic components at least partially vaporizes the working fluid channeled through said at least one expansion housing.

18. The power converter in accordance with claim 13, wherein said expansion housing comprises an interior defined by a first flat surface and a second flat surface that each extend between said flow inlet and said flow outlet, wherein said first flat surface and said second flat surface are angled relative to each other.

* * * * *